United States Patent
Ishida et al.

(10) Patent No.: US 10,319,503 B2
(45) Date of Patent: Jun. 11, 2019

(54) ELECTRONIC COMPONENT

(71) Applicant: MURATA MANUFACTURING CO., LTD., Kyoto-fu (JP)

(72) Inventors: Yuya Ishida, Nagaokakyo (JP); Koji Sawai, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 48 days.

(21) Appl. No.: 15/375,487

(22) Filed: Dec. 12, 2016

(65) Prior Publication Data

US 2017/0178777 A1 Jun. 22, 2017

(30) Foreign Application Priority Data

Dec. 16, 2015 (JP) ................. 2015-245466

(51) Int. Cl.
*H01F 17/04* (2006.01)
*H01F 1/147* (2006.01)
(Continued)

(52) U.S. Cl.
CPC ......... *H01F 1/14791* (2013.01); *C08G 77/04* (2013.01); *C08K 3/08* (2013.01); *C09J 183/04* (2013.01); *C23C 14/205* (2013.01); *H01C 7/10* (2013.01); *H01F 1/14733* (2013.01); *H01F 1/26* (2013.01); *H01F 17/045* (2013.01); *H01F 27/255* (2013.01); *H01F 27/2804* (2013.01); *H01F 27/2823* (2013.01); *H01F 27/292* (2013.01); *H01L 41/193* (2013.01); *C08G 77/045* (2013.01); *C08K 2003/0856* (2013.01); *H01C 1/148* (2013.01);
(Continued)

(58) Field of Classification Search
CPC ........ H01F 5/00; H01F 27/28; H01F 27/2823; H01F 27/255; H01F 27/2804
USPC .................................................. 336/200, 232
See application file for complete search history.

(56) References Cited

U.S. PATENT DOCUMENTS 4,797,648 A * 1/1989 Kaneko ................. H01F 27/292
228/124.1
8,399,577 B2 * 3/2013 Singh ................. C08G 59/4284
174/138 C (Continued)

FOREIGN PATENT DOCUMENTS

| JP | 63220506 A | * | 9/1988 | ........... H01F 27/292 |
|---|---|---|---|---|
| JP | 2002-151317 A | | 5/2002 | |
| JP | 2013-201374 A | | 10/2013 | |
| JP | 2015005565 A | | 1/2015 | |
| WO | 2009128425 A1 | | 10/2009 | |

OTHER PUBLICATIONS

An Office Action; "Notification of Reasons for Refusal," Mailed by the Japanese Patent Office dated Jul. 3, 2018, which corresponds to Japanese Patent Application No. 2015-245466 and is related to U.S. Appl. No. 15/375,487; with English language translation.

(Continued)

*Primary Examiner* — Tszfung J Chan
(74) *Attorney, Agent, or Firm* — Studebaker & Brackett PC

(57) ABSTRACT

An electronic component according to an embodiment of the present disclosure includes a formed article containing a cyclic siloxane resin or a branched siloxane resin serving as a first binder, and an outer electrode on at least part of a surface of the formed article, the outer electrode containing an early transition metal and/or an alloy thereof.

8 Claims, 2 Drawing Sheets

(51) Int. Cl.
    *C08G 77/04*     (2006.01)
    *C08K 3/08*     (2006.01)
    *C23C 14/20*     (2006.01)
    *H01C 7/10*     (2006.01)
    *H01F 27/255*     (2006.01)
    *H01F 27/28*     (2006.01)
    *H01L 41/193*     (2006.01)
    *C09J 183/04*     (2006.01)
    *H01F 1/26*     (2006.01)
    *H01F 27/29*     (2006.01)
    *H01G 4/018*     (2006.01)
    *H01C 1/148*     (2006.01)
    *H01G 4/232*     (2006.01)

(52) U.S. Cl.
    CPC ....... *H01F 2017/048* (2013.01); *H01G 4/018* (2013.01); *H01G 4/2325* (2013.01)

(56) References Cited

U.S. PATENT DOCUMENTS

| | | | | |
|---|---|---|---|---|
| 2002/0084882 | A1* | 7/2002 | Moro | H01F 3/08 336/233 |
| 2010/0237978 | A1* | 9/2010 | Brunner | B22F 1/0062 336/233 |
| 2013/0200972 | A1* | 8/2013 | Wada | H01F 27/02 336/90 |

OTHER PUBLICATIONS

An Office Action; "Notification of Reasons for Refusal," Mailed by the Japanese Patent Office dated Dec. 4, 2018, which corresponds to Japanese Patent Application No. 2015-245466 and is related to U.S. Appl. No. 15/375,487; with English language translation.

* cited by examiner

ELECTRONIC COMPONENT

CROSS REFERENCE TO RELATED APPLICATIONS

This application claims benefit of priority to Japanese Patent Application 2015-245466 filed Dec. 16, 2015, the entire content of which is incorporated herein by reference.

TECHNICAL FIELD

The present disclosure relates to an electronic component, and in particular, to an electronic component including an outer electrode.

BACKGROUND

Examples of electronic components provided with outer electrodes include coil components containing magnetic materials, capacitors containing dielectrics, piezoelectric devices containing piezoelectric materials, and varistors containing semiconductors. For example, Japanese Unexamined Patent Application Publication No. 2013-201374 discloses a planar coil that includes a coil portion covered with a magnetic metal powder-containing resin that contains an epoxy resin serving as a binder, and outer electrodes formed of multilayer metal films including a Cr layer deposited by sputtering, the outer electrodes being connected to a circuit on a mounting substrate.

SUMMARY

However, the use of the magnetic metal powder-containing resin that contains the epoxy resin disadvantageously leads to insufficient bond strength between the outer electrodes containing a high-oxygen-affinity metal, such as Cr, and the mounting substrate.

To deal with the problem, it is an object of the present disclosure to provide an electronic component having high bond strength when an outer electrode containing a high-oxygen-affinity metal, such as Cr, is used.

To solve the problem, the inventors have conducted intensive studies and have found that the combined use of a binder containing a cyclic siloxane resin or a branched siloxane resin and an outer electrode containing a high-oxygen-affinity metal such as Cr enables the bond strength between an outer electrode and a mounting substrate to be increased. This finding has led to the completion of the present disclosure. According to one embodiment of the present disclosure, an electronic component includes an outer electrode and a formed article containing a first binder that contains a cyclic siloxane resin or a branched siloxane resin, the outer electrode being arranged on at least part of a surface of the formed article and containing an early transition metal and/or an alloy of the early transition metal.

The cyclic siloxane resin may be prepared from a compound represented by formula (1):

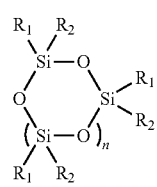

(1)

wherein in formula (1), n is an integer of about 1 or more and about 8 or less, one of $R_1$ and $R_2$ represents a reactive group containing an amino group, a vinyl group, an epoxy group, a hydroxy group, a phenolic group, an acryloyl group, a methacryloyl group, an oxetanyl group, a carboxy group, or a mercapto group, and the other represents hydrogen, an alkyl group having about 1 or more and about 6 or less carbon atoms, or a phenyl group.

The branched siloxane resin may be prepared from a compound represented by formula (2):

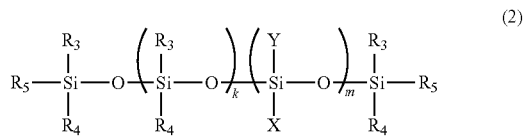

(2)

wherein in formula (2), k is an integer of about 0 or more and about 8 or less, m is an integer of about 0 or more and about 4 or less, provided that k and m are not 0 at the same time, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group, and a mercapto group, the remainder of $R_3$, $R_4$, and $R_5$ each represent hydrogen, an alkyl group having about 1 or more and about 6 or less carbon atoms, or a phenyl group, at least one of X and Y has a structure represented by formula (3) or (4), the other represents hydrogen, an alkyl group having about 1 or more and about 6 or less carbon atoms, or a phenyl group,

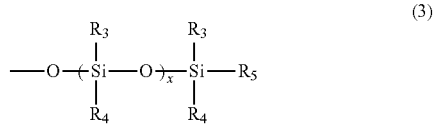

(3)

where in formula (3), x is about 0 or an integer of about 1 or more and about 8 or less, at least one of $R_3$, $R_4$, and $R_5$ represents a reactive group selected from an amino group, a vinyl group, an epoxy group, a hydroxy group, a phenolic group, an acryloyl group, a methacryloyl group, an oxetanyl group, a carboxy group, and a mercapto group, and the remainder of $R_3$, $R_4$, and $R_5$ each represent hydrogen, an alkyl group having about 1 or more and about 6 or less carbon atoms, or a phenyl group, and

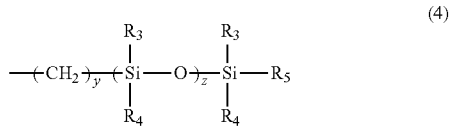

(4)

where in formula (4), y is an integer of about 1 or more and about 12 or less, z is an integer of about 1 or more and about 8 or less, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group, and a mercapto group, and the remainder of $R_3$, $R_4$, and $R_5$ each represent hydrogen, an alkyl group having about 1 or more and about 6 or less carbon atoms, or a phenyl group.

According to another embodiment of the present disclosure, as the early transition metal, one selected from the group consisting of Sc, Ti, V, Cr, Mn, Y, Zr, Nb, Mo, Tc, Hf, Ta, W, and Re may be used. The reason for this is that the binder represented by formula (1) or (2) imparts high bond strength to the outer electrode containing the early transition metal.

The formed article preferably contains about 1% by weight or more and about 8% by weight or less of the first binder. The reason for this is that in this range, high bond strength is imparted to the outer electrode.

The formed article preferably contains a second binder that is at least one selected from the group consisting of epoxy resins, phenolic resins, unsaturated polyester resins, silicone resins, polyimide resins, polyamide resins, polyurethane resins, polybutylene terephthalate resins, polyphenylene sulfide resins, polyphenylene ether resins, polyether ketone resins, and liquid-crystal polyester resins. The reason for this is that the second binder has compatibility with the binder represented by formula (1) or (2).

The formed article preferably contains about 1% by weight or more and about 8% by weight or less of the first binder and the second binder in total, and the ratio by weight of the first binder to the second binder is preferably about 1 or more to about 99 or less. The reason for this is that in this range, higher bond strength is imparted to the outer electrode.

The formed article preferably contains an Fe-based soft magnetic powder. The reason for this is that the use of the formed article as a magnetic core or a magnetic sheet provides a coil component having good magnetic characteristics.

The electronic component including the outer electrode is preferably a coil component. The reason for this is that the high bond strength between the outer electrode and the mounting substrate provides a coil component having low insulation resistance and improved reliability.

According to the embodiments of the present disclosure, the bond strength between the outer electrode and the mounting substrate is high because the formed article contains the first binder composed of the cyclic siloxane resin or the branched siloxane resin and the outer electrode contains Cr, V, or Ti having a high affinity for oxygen.

Other features, elements, characteristics and advantages of the present disclosure will become more apparent from the following detailed description of the present disclosure with reference to the attached drawings.

DETAILED DESCRIPTION

Figure 1:
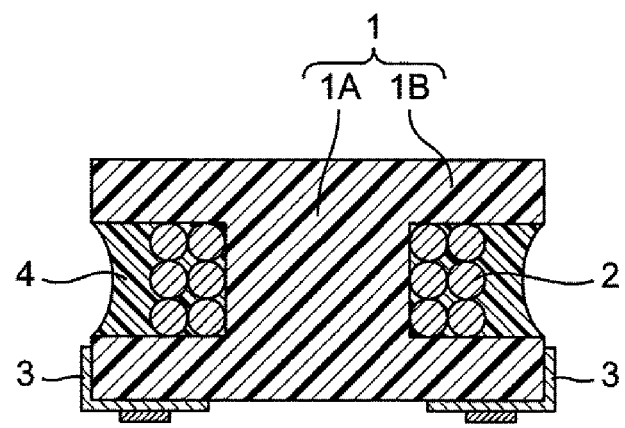
FIG. 1 is a schematic cross-sectional view illustrating an example of a cross-sectional structure of a coil component according to an embodiment of the present disclosure.

Embodiments of the present disclosure will be described below.

An electronic component according to an embodiment of the present disclosure is an electronic component including an outer electrode on a surface of a formed article. Examples thereof include coil components, such as wire-wound coil components including formed articles composed of magnetic cores and planar coil components including formed articles composed of magnetic sheets; dielectric elements including formed articles composed of dielectric sheets; piezoelectric elements including formed articles composed of piezoelectric sheets; and varistor elements including formed articles composed of semiconductor sheets.

Any formed article containing a binder may be used as the formed article. An example of the formed article is one produced by adding a binder to a powdery or fibrous filler, molding the mixture into a predetermined form with a mold or charging the mixture into an injection site to produce a predetermined form, and, optionally, curing the resulting article by heating. An article produced by impregnating a dielectric, magnetic, piezoelectric, or semiconductor ceramic formed article with a binder-containing solution and, optionally, curing the resulting article by heating is also included.

The outer electrode is an electrode that is arranged on at least part of a surface of the formed article and that is used for an electrical connection with another electronic component.

The first binder used in an embodiment of the present disclosure contains a cyclic siloxane resin or a branched siloxane resin. The cyclic siloxane resin has a cyclic siloxane structure. The cyclic siloxane structure is a cyclic structure having Si—O bonds alone. The number of Si—O bonds repeated in the cyclic siloxane structure is preferably in the range of about 3 to about 10 and more preferably about 3 or more and about 8 or less. The branched siloxane resin has a branched siloxane structure. The branched siloxane structure may include about three Si—O—Si bonds or about four Si—O—Si bonds. A specific example of the first binder used in an embodiment of the present disclosure may be prepared from a compound represented by formula (1) or (2) described below.

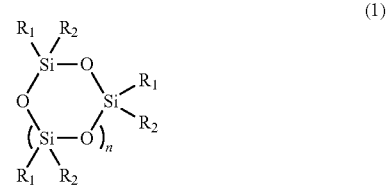

(1)

The cyclic siloxane resin used in the specification may be prepared of a compound that is a cyclic siloxane represented by formula (1). For example, the cyclic siloxane resin may be prepared by polymerization of a reactive group of a compound represented by formula (1). In formula (1), n is an integer of about 1 or more and about 8 or less and preferably about 3 or more and about 6 or less. When n is in this range, O (oxygen) atoms in the cyclic siloxane structure are easily arranged in a planar form. The O atoms arranged in a planar form will be bonded to the outer electrode containing a high-oxygen-affinity metal to improve adhesion. One of $R_1$ and $R_2$ represents a reactive group containing an amino group, a vinyl group, an epoxy group, a hydroxy group, a phenolic group, an acryloyl group, a methacryloyl group, an oxetanyl group, a carboxy group, or a mercapto group. The other represents hydrogen, an alkyl group having 1 or more and 6 or less carbon atoms, or a phenyl group. Preferably, at least one of $R_1$ and $R_2$ represents a vinyl group or an epoxy group, and the other represents a methyl group or a phenyl group. An example of the cyclic siloxane in which at least one of R₁ and R₂ represents a vinyl group is 2,4,6,8-tetramethyl-2,4,6,8-tetravinylcyclotetrasiloxane. When one of R₁ and R₂ represents a reactive group containing an epoxy group, an aliphatic epoxy group, an alicyclic epoxy group, or an aromatic epoxy group may be used as the epoxy group. Examples of the aliphatic epoxy group include butadiene dioxide, dimethylpentane dioxide, diglycidyl ether, 1,4-butanediol diglycidyl ether, 3-glycidyloxypropyl, diethylene glycol diglycidyl ether, and dipentene dioxide groups. As the alicyclic epoxy group, an alicyclic group having at least one about four- to seven-membered ring in its molecule and at least one epoxy group in its molecule may be used. An example of the alicyclic group is a (7-{oxabicyclo[4.1.0]heptyl})alkyl group. Examples of the aromatic epoxy group include bisphenol A-type epoxy, bisphenol F-type epoxy, phenol novolac epoxy, cresol-novolac epoxy, biphenol epoxy, and biphenyl epoxy groups.

As the cyclic siloxane represented by formula (1), a compound in which at least one of R₁ and R₂ represents an aliphatic epoxy group and the other represents a methyl group or a phenyl group may be used. For example, cyclotrisiloxanes, cyclotetrasiloxanes, and cyclopentanesiloxanes may be used, each of the siloxanes containing a 3-glycidyloxypropyl group that serves as the aliphatic epoxy group. 3-Glycidyloxypropyl group-containing cyclotetrasiloxanes are preferred.

As the cyclic siloxane represented by formula (1), a compound in which at least one of R₁ and R₂ represents an alicyclic epoxy group and the other represents a methyl group or a phenyl group may be used. For example, cyclotrisiloxanes, cyclotetrasiloxanes, and cyclopentanesiloxanes may be used, each of the siloxanes containing a (7-{oxabicyclo[4.1.0]heptyl})ethyl group that serves as the alicyclic epoxy group. (7-{Oxabicyclo[4.1.0]heptyl})ethyl group-containing cyclotetrasiloxanes are preferred. Specific examples of the cyclotetrasiloxanes include 2,4-di[2-(7-{oxabicyclo [4.1.0]heptyl})ethyl]-2,4,6,6,8,8-hexamethyl-cyclotetrasiloxane, 4,8-di[2-(7-{oxabicyclo[4.1.0]heptyl}) ethyl]-2,2,4,6,6,8-hexamethylcyclotetrasiloxane, 2,4-di[2-(7-{oxabicyclo[4.1.0]heptyl})ethyl]-6,8-dipropyl-2,4,6,8-tetramethylcyclotetrasiloxane, and 4,8-di[2-(7-{oxabicyclo[4.1.0]heptyl})ethyl]-2,6-dipropyl-2,4,6,8-tetramethylcyclotetrasiloxane, each of which contains two epoxy groups in its molecule; 2,4,8-tri[2-(7-{oxabicyclo[4.1.0]heptyl})ethyl]-2,4,6,6,8-pentamethylcyclotetrasiloxane and 2,4,8-tri[2-(7-{oxabicyclo[4.1.0]heptyl})ethyl]-6-propyl-2,4,6,8-tetramethylcyclotetrasiloxane, each of which contains three epoxy groups in its molecules; and 2,4,6,8-tetra[2-(7-{oxabicyclo[4.1.0]heptyl})ethyl]-2,4,6,8-tetramethycyclotetrasiloxane, which contains four epoxy groups in its molecules. 2,4,6,8-Tetra[2-(7-{oxabicyclo[4.1.0]heptyl})ethyl]-2,4,6,8-tetramethylcyclotetrasiloxane is preferred.

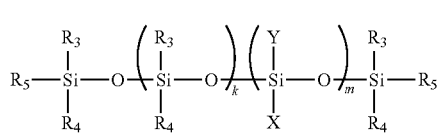

(2)

The branched siloxane resin used in the specification may be prepared from a compound that is a branched siloxane represented by formula (2). For example, the branched siloxane resin may be prepared by polymerization of a reactive group of a compound represented by formula (2). In formula (2), k is an integer of about 0 or more and about 8 or less, m is an integer of about 0 or more and about 4 or less, provided that k and m are not 0 at the same time. At least one of $R_3$, $R_4$, and $R_5$ represents a reactive group selected from an amino group, a vinyl group, an epoxy group, a hydroxy group, a phenolic group, a methacrylic group, a carboxy group, or a mercapto group. The remainder of $R_3$, $R_4$, and $R_5$ each represent hydrogen, an alkyl group having about 1 or more and about 6 or less carbon atoms, or a phenyl group. At least one of X and Y has a structure represented by formula (3) or (4). The other represents hydrogen, an alkyl group having about 1 or more and about 6 or less carbon atoms, or a phenyl group. Preferably, at least one of $R_3$, $R_4$, and $R_5$ represents a vinyl group or an epoxy group, and the remainder of $R_3$, $R_4$, and $R_5$ each represent a methyl group or a phenyl group. When at least one of $R_3$, $R_4$, and $R_5$ represents an epoxy group, an aliphatic epoxy group, an alicyclic epoxy group, or an aromatic epoxy group may be used as the epoxy group. Examples of the aliphatic epoxy group include butadiene dioxide, dimethylpentane dioxide, diglycidyl ether, 1,4-butanediol diglycidyl ether, 3-glycidyloxypropyl, diethylene glycol diglycidyl ether, and dipentene dioxide groups. As the alicyclic epoxy group, an alicyclic group having at least one approximately four- to seven-membered ring in its molecule and at least one epoxy group in its molecule may be used. An example of the alicyclic group is a (7-{oxabicyclo[4.1.0]heptyl})alkyl group. Examples of the aromatic epoxy group include bisphenol A-type epoxy, bisphenol F-type epoxy, phenol novolac epoxy, cresol-novolac epoxy, biphenol epoxy, and biphenyl epoxy groups. Preferably, $R_3$ and $R_4$ each represent a methyl group, and $R_5$ represents a (7-{oxabicyclo[4.1.0]heptyl})ethyl group.

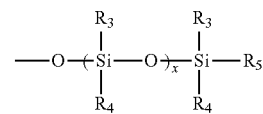

(3)

In formula (3), x is about 0 or an integer of about 1 or more and about 8 or less. At least one of $R_3$, $R_4$, and $R_5$ represents a reactive group selected from an amino group, a vinyl group, an epoxy group, a hydroxy group, a phenolic group, an acryloyl group, a methacryloyl group, an oxetanyl group, a carboxy group, or a mercapto group. The remainder of $R_3$, $R_4$, and $R_5$ each represent hydrogen, an alkyl group having about 1 or more and about 6 or less carbon atoms, or a phenyl group. $R_3$, $R_4$, and $R_5$ may be selected from the same groups as those in the case of formula (2). Preferably, $R_3$ and $R_4$ each represent a methyl group, and $R_5$ represents a (7-{oxabicyclo[4.1.0]heptyl})ethyl group.

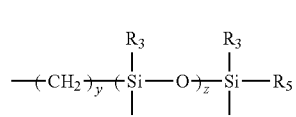

(4)

In formula (4), y is an integer of about 1 or more and about 12 or less and preferably an integer of about 2 or more and about 8 or less. z is an integer of about 1 or more and about 8 or less and preferably an integer of about 2 or more and about 6 or less. At least one of $R_3$, $R_4$, and $R_5$ represents a reactive group selected from an amino group, a vinyl group, an epoxy group, a hydroxy group, a phenolic group, an acryloyl group, a methacryloyl group, an oxetanyl group, a carboxy group, and a mercapto group. The remainder of $R_3$, $R_4$, and $R_5$ each represent hydrogen, an alkyl group having about 1 or more and about 6 or less carbon atoms, or a phenyl group. $R_3$, $R_4$, and $R_5$ may be selected from the same groups as those in the case of formula (2). Preferably, $R_3$ and $R_4$ each represent a methyl group, and $R_5$ represents a (7-{oxabicyclo[4.1.0]heptyl})ethyl group.

Specific examples of the branched siloxane represented by formula (2) include a compound in which k is about 0, m is about 1, X and Y are each represented by formula (3), $R_3$ and $R_4$ each represent a methyl group, and $R_5$ represents a (7-{oxabicyclo[4.1.0]heptyl})ethyl group; and a compound in which k is about 0, m is about 1, X is represented by formula (3), Y, $R_3$, and $R^4$ each represent a methyl group, and $R^5$ represents a (7-{oxabicyclo[4.1.0]heptyl})ethyl group.

In embodiments of the present disclosure, the formed article may further contain a second binder in addition to the first binder. Examples of the second binder include epoxy resins, phenolic resins, unsaturated polyester resins, silicone resins, polyimide resins, polyamide resins, polyurethane resins, polybutylene terephthalate resins, polyphenylene sulfide resins, polyphenylene ether resins, polyether ketone resins, and liquid-crystal polyester resins. When the first binder is prepared from a compound containing an epoxy group that serves as a reactive group, an epoxy resin is preferable as the second binder in view of compatibility.

The total content of the first binder and the second binder is about 1% by weight or more and about 8% by weight or less and preferably about 2% by weight or more and about 6% by weight or less with respect to the total weight of the formed article. The ratio by weight of the first binder to the second binder is in the range of about 100:0 to about 1:99 and preferably in the range of about 30:70 to about 5:95.

A raw material (for example, a compound represented by formula (1)) for the first binder is mixed with a desired filler optionally together with a raw material (a compound represented by formula (2)) for the second binder, injected into a mold or the like to mold the mixture into a predetermined form, and cured. For the curing, the mixture may be heated at a temperature at which the binder is not decomposed. The heating temperature is about 500° C. or lower and preferably about 200° C. or lower.

For the curing, a curing agent and a curing catalyst are used. Examples of the curing agent that may be used include acid anhydride-based curing agents containing acid anhydrides, such as phthalic anhydride, maleic anhydride, and trimellitic anhydride; amine-based curing agents containing amines, such as diaminodiphenylmethane; and phenol-based curing agents containing phenols, such as phenol novolac and cresol novolac. The amount of the curing agent added is about 1 part by weight or more and about 40 parts by weight or less and preferably about 5 parts by weight or more and about 30 parts by weight or less with respect to 100 parts by weight of the total weight of the first binder and the second binder.

Examples of the curing catalyst include organic tin compounds, monobutyltin tris(2-ethylhexanoate) and dimethyltin dineodecanoate; quaternary ammonium salt compounds, such as 2-hydroxyethyl-tri-n-butylammonium-2,2-dimethylpropionate; tertiary amine compounds, such as dimethylethanolamine and triethylenediamine; and organic titanium compounds, such as tetraisopropoxytitanium. These compounds may be used separately or in combination as a mixture of two or more. The amount of the curing catalyst added is about 0.1 parts by weight or more and about 10 parts by weight or less and preferably about 0.5 parts by weight or more and about 5 parts by weight or less with respect to 100 parts by weight of the total weight of the first binder and the second binder.

The filler in the formed article may be appropriately selected, depending on the type of electronic component to be produced. For example, when the electronic component is a wire-wound coil component, a winding core portion is formed of the formed article. As the filler, a soft magnetic material, for example, Fe, FeNi, FeCo, FeSi, FeSiCr, FeSiAl, or FeSiBCr, may be used. The soft magnetic material preferably has a surface that has been subjected to insulation treatment. In the case of a planar coil component, the soft magnetic material may be used as a magnetic material in a magnetic sheet. The content of the soft magnetic material in the winding core portion or the magnetic sheet is about 90% by weight or more and about 99% by weight or less and preferably about 96% by weight or more and about 98% by weight or less of the total weight of the formed article.

An example of another filler is an Fe-based amorphous alloy containing P or the like.

In embodiments of the present disclosure, the outer electrode arranged on a surface of the formed article contains an early transition metal and/or an alloy thereof. The early transition metal used here is selected from groups 3 to 7 elements of the periodic table. Specific examples thereof include Sc, Ti, V, Cr, Mn, Y, Zr, Nb, Mo, Tc, Hf, Ta, W, and Re. The early transition metal used here is preferably Ti, V, Cr, Mn, Y, Zr, or Nb, and more preferably Ti, V, or Cr. The alloy of the early transition metal refers to an alloy of Ti, V, or Cr. Examples thereof include NiTi, NiV, and NiCr. The early transition metal has a higher oxygen affinity than, for example, copper and thus interacts strongly with an oxygen-containing functional group, (for example, an OH group or a C=O group) in the resin of the formed article. This enables the early transition metal to adsorb to the resin using physical bonding, chemical bonding, or the like. The outer electrode may have a single-layer structure or a multilayer structure in which different metal layers are laminated. In the case of the multilayer structure, a layer at least in contact with the outer electrode is required to contain the early transition metal and/or the alloy thereof.

In the electronic component according to embodiments of the present disclosure, the reason for the high bond strength between the outer electrode and the mounting substrate is not clear in detail. However, the reason is presumably as follows: The first binder has a cyclic siloxane structure or a branched siloxane structure. Thus, O (oxygen) atoms bonded to Si are easily arranged in one plane, compared with linear siloxane in the related art. The O (oxygen) atoms arranged in the plane come easily into close contact with the outer electrode composed of a high-oxygen-affinity metal.

Regarding a method for producing an electronic component according to an embodiment of the present disclosure, for example, a method for producing a wire-wound coil component serving as an electronic component according to an embodiment of the present disclosure will be described below. FIG. 1 is a cross-sectional view illustrating an example of the structure of a wire-wound coil component. The wire-wound coil component includes a core 1 including a winding core portion 1A and collar portions 1B arranged on upper and lower ends thereof, a winding wire 2 wound around the winding core portion 1A, outer electrodes 3 arranged on the lower collar portion 1B, each of the ends of the winding wire 2 being electrically connected to a corresponding one of the outer electrodes 3, and a magnetic resin portion 4 that seals the winding wire 2 between the upper and lower collar portions 1B. The core 1 may be produced by mixing a soft magnetic material powder with the first binder and, optionally, the second binder, forming the mixture into a core form, and then heating the mixture to cure the first binder. The outer electrodes are formed of metal films composed of an early transition metal, for example, Cr, V, or Ti. The metal films may be formed by a sputtering method. When a surface of each of the outer electrodes in contact with the core is formed of a metal film composed of an early transition metal, the other surfaces of each outer electrode may be formed of different metal films.

A planar coil component may be produced by mixing a soft magnetic material powder with the first binder and, optionally, the second binder, forming the mixture into magnetic sheets, forming electrode coil patterns on the magnetic sheets, stacking the magnetic sheets provided with the electrode coil patterns, cutting the stacked magnetic sheets, curing the cut magnetic sheets by heating, and forming metal films composed of Cr, V, Ti, or the like as outer electrodes by a sputtering method. The outer electrodes may be subjected to Ni plating or Sn plating.

In the case where the electronic component is a coil component, the electronic component includes a coil, a core including the first binder and a soft magnetic material powder, and outer electrodes arranged on a surface of the core and electrically connected to the coil. Each of the outer electrodes is formed of a film composed of an early transition metal. That is, each outer electrode is formed of a film composed of a metal with a high affinity for oxygen. Each outer electrode may be preferably formed of one metal film selected from a Cr film, a V film, a Ti film, a Cr-containing alloy film, a V-containing alloy film, and a Ti-containing alloy film. The core may contain the second binder in addition to the first binder. The coil may be formed of a metal wire wound in a coil-like form, a coil-like conductor formed from a paste, or a coil-pattern conductor formed by etching a metal film.

EXAMPLES

While embodiments of the present disclosure will be described in more detail by examples, the present disclosure is not limited to these examples described below.

Example 1

Production of Test Piece

Figure 2:
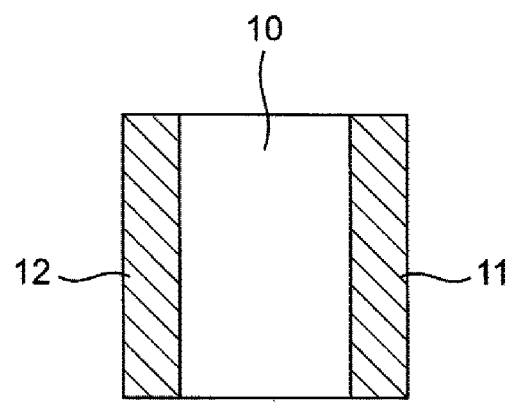
FIG. 2 is a bottom view of a test piece used in an example according to an embodiment of the present disclosure.

In this example, a cyclic siloxane resin in which the number of Si—O bonds repeated was about four was used as a first binder. The cyclic siloxane resin was prepared from a cyclic siloxane (X-40-2670, manufactured by Shin-Etsu Chemical Co., Ltd.) represented by formula (1) where n=about 2. Specifically, a magnetic powder of FeSiCr was mixed with the cyclic siloxane. The resulting mixture was formed with a mold into a substantially rectangular parallelepiped about 3 mm long by about 3 mm wide by about 1 mm high. The formed mixture was heated to about 200° C. for about 1 hour to cure the cyclic siloxane, thereby resulting in a formed article. Subsequently, outer electrodes were formed by forming metal films by a sputtering method on two portions of the undersurface of the formed article that had been cured, the metal films being composed of a Cr alloy (composition: NiCr). FIG. 2 is a bottom view of a test piece. Metal films 11 and each having a width of about 0.9 mm were formed on the respective ends of the undersurface of a test piece 10. The formed article had a cyclic siloxane resin content of about 3% by weight.

Measurement of Resistivity

The resistivity (Ω·cm) of the test piece was measured by applying a voltage of about 10 V to the test piece at room temperature for about 5 seconds with an ultra-high resistance meter (Model: R8340A, manufactured by Advantest Corporation). Table 1 lists the results.

Measurement of Bond Strength

The test piece was mounted on a mounting substrate with a solder paste. The bond strength (N) between the test piece and the mounting substrate was measured according to a measurement method of AEC-Q200. Table 1 lists the results.

Example 2

A test piece was produced as in Example 1, except that an epoxy resin was used as a second binder and that the ratio by weight of the first binder to the second binder was about 1:99. Table 1 lists the results. The total content of the first binder and the second binder was about 3% by weight, similarly to the case of Example 1.

Example 3

A test piece was produced as in Example 2, except that the ratio by weight of the first binder to the second binder was about 5:95. Table 1 lists the results.

Example 4

A test piece was produced as in Example 2, except that the ratio by weight of the first binder to the second binder was about 10:90. Table 1 lists the results.

Example 5

A test piece was produced as in Example 2, except that the ratio by weight of the first binder to the second binder was about 15:85. Table 1 lists the results.

Example 6

A test piece was produced as in Example 2, except that the ratio by weight of the first binder to the second binder was about 20:80. Table 1 lists the results.

Example 7

A test piece was produced as in Example 2, except that the ratio by weight of the first binder to the second binder was about 25:75. Table 1 lists the results.

Example 8

A test piece was produced as in Example 1, except that a cyclic siloxane resin in which the number of Si—O bonds repeated was about five was used as the first binder, in other words, the cyclic siloxane resin was prepared from a cyclic siloxane represented by formula (1) where n=about 3. Table 1 lists the results.

Example 9

A test piece was produced as in Example 1, except that a branched siloxane resin having a branched siloxane structure with about three Si—O—Si bonds was used as the first binder, in other words, a branched siloxane represented by formula (2) was used. Table 1 lists the results.

Example 10

A test piece was produced as in Example 1, except that a cyclic siloxane resin in which the number of Si—O bonds repeated was about six was used as the first binder, in other words, the cyclic siloxane resin was prepared from a cyclic siloxane represented by formula (1) where n=about 4. Table 1 lists the results.

Example 11

A test piece was produced as in Example 1, except that a branched siloxane resin having a branched siloxane structure with about four Si—O—Si bonds was used as the first binder, in other words, a branched siloxane represented by formula (2) where X and Y are each represented by formula (3) was used. Table 1 lists the results.

Example 12

A test piece was produced as in Example 1, except that Ti alloy films (composition: NiTi) were used as the outer electrodes in place of the Cr alloy films. Table 1 lists the results.

Comparative Example 1

A test piece was produced as in Example 1, except that an epoxy resin was used in place of the first binder of Example 1. Table 1 lists the results.

Comparative Example 2

A test piece was produced as in Example 1, except that a linear siloxane resin (SR2414LV, manufactured by Dow Corning Toray Silicone Co., Ltd.) was used in place of the first binder of Example 1. Table 1 lists the results.

Results

As listed in Table 1, the bond strength in Comparative examples 1 and 2 were about 40 N and about 45 N, respectively. In contrast, in each of Examples 1 to 12, a very high bond strength of more than about 200 N was obtained while maintaining high resistivity of the order of about $10^{13}$.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. An electronic component, comprising:
a formed article containing a first binder that contains a cyclic siloxane resin or a branched siloxane resin; and
an outer electrode on at least part of a surface of the formed article, the outer electrode containing an early transition metal and an alloy of the early transition metal,
wherein the cyclic siloxane resin comprises a compound represented by formula (1):

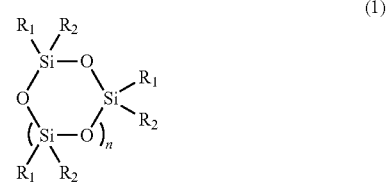

where in formula (1), n is an integer of about 1 or more and about 8 or less, one of $R_1$ and $R_2$ represents a reactive group containing an amino group, a vinyl group, an epoxy group, a hydroxy group, a phenolic group, an acryloyl group, an oxetanyl group, a methacryloyl group, a carboxy group, or a mercapto group, and the other represents hydrogen, an alkyl group having about 1 or more and about 6 or less carbon atoms, or a phenyl group, and
wherein the branched siloxane resin comprises a compound represented by formula (2):

TABLE 1

| | Resin composition | | | | | |
|---|---|---|---|---|---|---|
| | First binder | Second binder | First binder/second binder (ratio by weight) | Outer electrode | Bond strength (N) | Resistivity (Ω · cm) |
| Example 1 | cyclic siloxane resin | — | — | Cr alloy | about 215 | about 2 × $10^{13}$ |
| Example 2 | " | epoxy resin | about 1/99 | Cr alloy | about 200 | about 3 × $10^{13}$ |
| Example 3 | " | " | about 5/95 | Cr alloy | about 201 | about 5 × $10^{13}$ |
| Example 4 | " | " | about 10/90 | Cr alloy | about 205 | about 2 × $10^{13}$ |
| Example 5 | " | " | about 15/85 | Cr alloy | about 210 | about 3 × $10^{13}$ |
| Example 6 | " | " | about 20/80 | Cr alloy | about 208 | about 3 × $10^{13}$ |
| Example 7 | " | " | about 25/75 | Cr alloy | about 203 | about 2 × $10^{13}$ |
| Example 8 | cyclic siloxane resin | — | — | Cr alloy | about 211 | about 4 × $10^{13}$ |
| Example 9 | branched siloxane resin | — | — | Cr alloy | about 203 | about 2 × $10^{13}$ |
| Example 10 | cyclic siloxane resin | — | — | Cr alloy | about 209 | about 3 × $10^{13}$ |
| Example 11 | branched siloxane resin | — | — | Cr alloy | about 204 | about 1 × $10^{13}$ |
| Example 12 | cyclic siloxane resin | — | — | Ti alloy | about 215 | about 2 × $10^{13}$ |
| Comparative example 1 | epoxy resin | — | — | Cr alloy | about 40 | about 1 × $10^{13}$ |
| Comparative example 2 | linear polysiloxane resin | — | — | Cr alloy | about 45 | about 7 × $10^{13}$ |

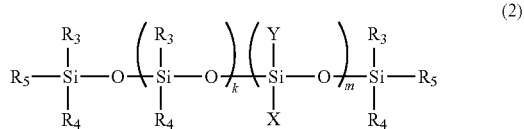

(2)

where in formula (2), k is an integer of about 0 or more and about 8 or less, m is an integer of about 0 or more and about 4 or less, provided that k and m are not 0 at the same time, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group, and a mercapto group, the remainder of $R_3$, $R_4$, and $R_5$ each represent hydrogen, an alkyl group having about 1 or more and about 6 or less carbon atoms, or a phenyl group, at least one of X and Y has a structure represented by formula (3) or (4), the other represents hydrogen, an alkyl group having about 1 or more and about 6 or less carbon atoms, or a phenyl group,

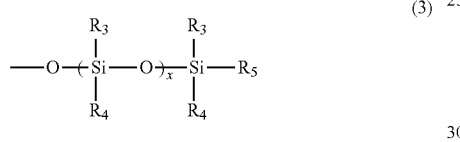

(3)

where in formula (3), x is about 0 or an integer of about 1 or more and about 8 or less, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group and a mercapto group, and the remainder of $R_3$, $R_4$, and $R_5$ each represent hydrogen, an alkyl group having about 1 or more and about 6 or less carbon atoms, or a phenyl group, and

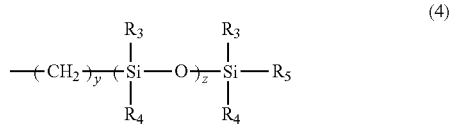

(4)

where in formula (4), y is an integer of about 1 or more and about 12 or less, z is an integer of about 1 or more and about 8 or less, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group, and a mercapto group, and the remainder of $R_3$, $R_4$, and $R_5$ each represent hydrogen, an alkyl group having about 1 or more and about 6 or less carbon atoms, or a phenyl group.

2. The electronic component according to claim 1, wherein the formed article contains about 1% by weight or more and about 8% by weight or less of the first binder.

3. The electronic component according to claim 1, wherein the formed article contains a second binder that is at least one selected from the group consisting of epoxy resins, phenolic resins, unsaturated polyester resins, silicone resins, polyimide resins, polyamide resins, polyurethane resins, polybutylene terephthalate resins, polyphenylene sulfide resins, polyphenylene ether resins, polyether ketone resins, and liquid-crystal polyester resins.

4. The electronic component according to claim 3, wherein the formed article contains about 1% by weight or more and about 8% by weight or less of the first binder and the second binder in total, and
wherein the ratio by weight of the first binder to the second binder is about 1 or more to about 99 or less.

5. The electronic component according to claim 1, wherein the formed article contains an Fe-based soft magnetic powder.

6. The electronic component according to claim 1, wherein the electronic component including the outer electrode is a coil component.

7. An electronic component, comprising:
a formed article containing a first binder that contains a cyclic siloxane resin or a branched siloxane resin; and
an outer electrode on at least part of a surface of the formed article, the outer electrode containing at least one of an early transition metal and an alloy of the early transition metal,
wherein the cyclic siloxane resin comprises a compound represented by formula (1):

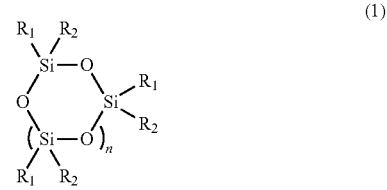

(1)

where in formula (1), n is an integer of about 1 or more and about 8 or less, one of $R_1$ and $R_2$ represents a reactive group containing an amino group, a vinyl group, an epoxy group, a hydroxy group, a phenolic group, an acryloyl group, an oxetanyl group, a methacryloyl group, a carboxy group, or a mercapto group, and the other represents hydrogen, an alkyl group having about 1 or more and about 6 or less carbon atoms, or a phenyl group.

8. An electronic component, comprising:
a formed article containing a first binder that contains a cyclic siloxane resin or a branched siloxane resin; and
an outer electrode on at least part of a surface of the formed article, the outer electrode containing at least one of an early transition metal and an alloy of the early transition metal,
wherein the branched siloxane resin comprises a compound represented by formula (2):

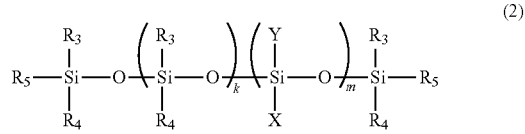

(2)

where in formula (2), k is an integer of about 0 or more and about 8 or less, m is an integer of about 0 or more and about 4 or less, provided that k and m are not 0 at the same time, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group, and a mercapto group, the remainder of $R_3$, $R_4$, and $R_5$ each represent hydrogen, an alkyl group having about 1 or more and about 6 or less carbon atoms, or a phenyl group, at least one of X and Y has a structure represented by formula (3) or (4), the other represents hydrogen, an alkyl group having about 1 or more and about 6 or less carbon atoms, or a phenyl group,

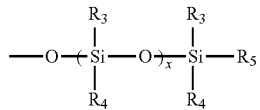
(3)

where in formula (3), x is about 0 or an integer of about 1 or more and about 8 or less, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group and a mercapto group, and the remainder of $R_3$, $R_4$, and $R_5$ each represent hydrogen, an alkyl group having about 1 or more and about 6 or less carbon atoms, or a phenyl group, and

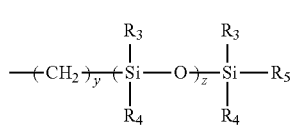
(4)

where in formula (4), y is an integer of about 1 or more and about 12 or less, z is an integer of about 1 or more and about 8 or less, at least one of $R_3$, $R_4$, and $R_5$ represents a reactive group selected from an amino group, a vinyl group, an epoxy group, a hydroxy group, a phenolic group, a methacryloyl group, an acryloyl group, an oxetanyl group, a carboxy group, and a mercapto group, and the remainder of $R_3$, $R_4$, and $R_5$ each represent hydrogen, an alkyl group having about 1 or more and about 6 or less carbon atoms, or a phenyl group.

* * * * *